(12) United States Patent
Eckstein et al.

(10) Patent No.: US 8,363,688 B2
(45) Date of Patent: Jan. 29, 2013

(54) EDGE EMITTING SEMICONDUCTOR LASER (75) Inventors: Hans-Christoph Eckstein, Jena (DE); Uwe D. Zeitner, Weimar (DE); Wolfgang Schmid, Regensburg (DE)

(73) Assignees: Fraunhofer-Gesellschaft zur Foerderung der Angewandten Forschung E. V., Munich (DE); OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/130,444

(22) PCT Filed: Nov. 19, 2009

(86) PCT No.: PCT/EP2009/065488
§ 371 (c)(1),
(2), (4) Date: Sep. 7, 2011

(87) PCT Pub. No.: WO2010/057955
PCT Pub. Date: May 27, 2010

(65) Prior Publication Data
US 2011/0317732 A1 Dec. 29, 2011

(30) Foreign Application Priority Data
Nov. 21, 2008 (DE) .......................... 10 2008 058 435

(51) Int. Cl.
*H01S 5/00* (2006.01)
(52) U.S. Cl. ............. 372/46.014; 372/43.01; 372/45.01; 372/46.01; 372/46.016
(58) Field of Classification Search ............... 372/43.01, 372/45.01, 46.01, 46.014, 46.016
See application file for complete search history.

(56) References Cited

U.S. PATENT DOCUMENTS

| | | | |
|---|---|---|---|
| 5,247,536 A | 9/1993 | Kinoshita | |
| 6,122,299 A | 9/2000 | DeMars et al. | |
| 6,810,054 B2 | 10/2004 | Sousa et al. | |
| 6,920,160 B2 | 7/2005 | Zeitner et al. | |
| 2003/0219053 A1 | 11/2003 | Swint et al. | |
| 2005/0041709 A1 | 2/2005 | Anikitchev et al. | |
| 2005/0254538 A1 | 11/2005 | Asatsuma et al. | |
| 2007/0133648 A1 | 6/2007 | Matsuda et al. | |
| 2007/0201528 A1* | 8/2007 | Nagatomo et al. | 372/50.124 |
| 2011/0122907 A1 | 5/2011 | Schmid et al. | |

FOREIGN PATENT DOCUMENTS

DE 10 2008 025 922 A1 12/2009
WO WO 01/97349 A1 12/2001

OTHER PUBLICATIONS

Chan, et al., "Quantum Electronics Letters," IEEE Journal of Quantum Electronics, vol. 24, No. 3, Mar. 1988, pp. 489-495.

* cited by examiner

*Primary Examiner* — Yuanda Zhang
(74) *Attorney, Agent, or Firm* — Slater & Matsil, L.L.P.

(57) ABSTRACT

An edge emitting semiconductor laser includes a semiconductor body having a wave guide area. The wave guide area comprises a lower cover layer, a lower wave guide layer, an active layer for generating laser radiation, an upper wave guide layer and an upper cover layer. The wave guide area also includes at least one structured laser radiation scattering area in which a lateral base laser radiation mode experiences less scattering losses than the radiation of higher laser modes.

13 Claims, 6 Drawing Sheets

EDGE EMITTING SEMICONDUCTOR LASER

This patent application is a national phase filing under section 371 of PCT/EP2009/065488, filed Nov. 19, 2009, which claims the priority of German patent application 10 2008 058 435.5, filed Nov. 21, 2008, each of which is incorporated herein by reference in its entirety.

TECHNICAL FIELD

The invention relates to an edge emitting semiconductor laser, in particular a broad stripe laser.

BACKGROUND

Laser diodes having high output powers are principally produced as so-called broad stripe lasers. In this case, the amplification of the optical field takes place in an active layer, which contains a quantum well structure, for example. The active layer of the semiconductor laser is typically embedded in waveguide layers in which the laser modes can propagate. The performance of the semiconductor laser is limited by the power density of the laser modes in the facet region. Excessively high peak field strengths at the side facet lead to the melting of the semiconductor material and to the destruction of the semiconductor laser. This damage to the laser is referred to as COMD (Catastrophic Optical Mirror Damage).

By virtue of a large lateral extent of the active layer, a high optical power can be coupled out from the edge emitter, without the critical power density being exceeded. As the active layer is widened, however, the number of transverse modes which can be amplified in this direction in the waveguide also increases, which results in a deterioration in the beam quality of the laser radiation coupled out.

For most applications of semiconductor lasers, operation in the transverse fundamental mode (single-mode laser) is desirable since the intensity profile of the lateral fundamental mode facilitates beam shaping and, in particular, the coupling of the laser radiation into optical waveguides. Moreover, the maximum power of the semiconductor laser can be increased in this case since the fundamental mode typically has no pronounced intensity peaks.

During the amplification of the desired lateral fundamental mode in the waveguide of the semiconductor laser, the amplification of the semiconductor material is selectively reduced locally, in particular, in a central region of the waveguide. On the other hand, the amplification still remains high in the edge regions of the waveguide. This amplification can suffice to cause higher modes to commence oscillation. Experimental investigations on broad stripe lasers show that the intensity distributions of the emitted radiation tend toward power boosting in the outer region of the active zone. This observation can be explained by the superposition of higher modes that experience a high degree of amplification in the outer region of the waveguide.

One approach for shaping the laser modes in semiconductor broad stripe lasers involves introducing so-called phase structures. This is described in the document WO 01/97349 A1.

SUMMARY OF THE INVENTION

In one aspect, the invention specifies an improved edge emitting semiconductor laser which is distinguished by a high beam quality, in particular, operation in the lateral fundamental mode.

In accordance with one embodiment, the edge emitting semiconductor laser, which is preferably a broad stripe laser, contains a semiconductor body having a waveguide region. The waveguide region preferably contains a layer sequence composed of a lower cladding layer, a lower waveguide layer, an active layer for generating laser radiation, an upper waveguide layer and an upper cladding layer. The lower and upper cladding layers advantageously have a lower refractive index than the waveguide layers into which the active layer is embedded. What is achieved in this way is that the laser radiation is substantially guided in the waveguide core formed from the waveguide layers with the embedded active layer.

The waveguide region advantageously has at least one structured region for mode selection. The structured region is structured in such a way that the lateral fundamental mode of the laser radiation experiences lower losses than the radiation of higher laser modes. On account of the structured region, the laser radiation which propagates in the waveguide region experiences local losses, wherein the structured region is formed in such a way that higher laser modes are damped to a greater extent than the lateral fundamental mode. What can be achieved in this way, in particular, is that only the lateral fundamental mode commences oscillation during the operation of the semiconductor laser.

By virtue of the fact that higher modes of the laser radiation are suppressed and preferably only the lateral fundamental mode commences oscillation, a high beam quality of the edge emitting semiconductor laser is obtained. In particular, the beam profile of the lateral fundamental mode is well suited to beam shaping with optical elements and, in particular, to coupling into an optical fiber with high efficiency. Furthermore, in this way, intensity peaks at the side facet of the semiconductor laser at which the radiation is coupled out are reduced, such that a high output power can be obtained with the semiconductor laser.

The at least one structured region is preferably formed exclusively in the upper waveguide layer and the upper cladding layer. In particular, the structured region does not extend right into the active layer of the edge emitting semiconductor laser, the active layer being formed, for example, as a single or multiple quantum well structure.

Particularly preferably, the at least one structured region is formed exclusively in the upper cladding layer. This configuration makes use of the fact that although the laser radiation propagates substantially in the waveguide core formed from the waveguide layers and the active layer embedded therein, the mode profile propagates at least partly into the cladding layers owing to the finite refractive index jump between the waveguide layers and the cladding layers. Consequently, losses which prevent higher laser modes from commencing oscillation can also be supplied to the laser modes in a targeted manner by means of structures in the upper cladding layer. Overall, however, the damping of the laser radiation by the structured region in the upper cladding layer is only advantageously low, such that a comparatively high output power can be obtained with the edge emitting semiconductor laser.

In one preferred embodiment, the structured region comprises at least one trench which extends from a top side of the semiconductor body into the waveguide region. The at least one trench is preferably only formed in the upper cladding layer of the waveguide region, that is to say that its depth is not greater than the thickness of the upper cladding layer. The depth of the at least one trench is preferably chosen such that less than 300 nm of the upper waveguide layer remains below the deepest location of the trench.

The at least one trench preferably has a depth of between 500 nm and 1500 nm inclusive. The width of the at least one trench is preferably between 1 µm and 4 µm inclusive. The at least one trench can be produced, for example, by means of an etching process in the semiconductor material of the waveguide region, in particular, the upper cladding layer.

Preferably, the at least one trench runs parallel to a side facet of the semiconductor laser. Therefore, the laser radiation preferably impinges perpendicularly on the at least one trench as it propagates in the waveguide region. Upon traversing the trench, the laser radiation experiences scattering losses in each case upon entering into the trench at a first sidewall of the trench and upon exiting from the trench at a second sidewall of the trench. The laser radiation is advantageously damped by less than ten percent, preferably by less than five percent, during a passage through the trench. By way of example, a loss of approximately two percent can occur when a trench is traversed. The magnitude of the loss experienced by the laser radiation upon traversing the trench is dependent, in particular, on the form and the depth of the trench and also, in the case of a plurality of trenches, on the number of trenches.

In one advantageous configuration, the at least one trench extends from an edge region of the waveguide region in the direction of the center of the waveguide region. The center of the waveguide region is preferably free of trenches. What can be achieved in this way is that higher transverse laser modes which propagate in the edge regions of the waveguide region experience higher losses than the transverse fundamental mode having an intensity maximum in the center of the waveguide region.

In a further advantageous configuration, a multiplicity of trenches extend from an edge region of the waveguide region into the center of the waveguide region to different extents. The trenches are preferably arranged in such a way that the number of trenches which are passed by the laser radiation propagating in the waveguide region decreases from the edge region toward the central region of the waveguide. What is achieved in this way is that higher laser modes having significant intensities in the edge regions of the waveguide region experience, on account of the larger number of trenches in the edge region, higher losses than the central fundamental mode, the intensity maximum of which is situated in the center of the waveguide region. In particular, a central region of the waveguide region can be free of trenches.

In a further advantageous configuration, the at least one trench has a variable depth. In this case, the depth of the trench decreases from an edge region toward a central region of the waveguide region. By way of example, one or a plurality of trenches can be led from the center of the waveguide region on both sides toward the edge regions of the waveguide region, wherein the depth of the trench increases from the inner side outward. Since the losses experienced by the propagating laser radiation upon traversing the at least one trench increase as the depth of the trench increases, the intensity of the losses can be varied locally by the setting of the depth of the at least one trench. By means of a larger depth of the at least one trench in the outer regions of the waveguide region in comparison with the center of the waveguide region, higher laser modes experience greater losses than the central fundamental mode.

In a further configuration, the at least one trench has sidewalls having a variable form. The form of the sidewalls preferably varies in a longitudinal direction of the trench. In particular, the sidewalls can have a variable sidewall steepness. Preferably, the sidewall steepness decreases from an edge region toward a central region of the waveguide region. What can be achieved in this way is that the higher laser modes at the steep sidewalls of the edge regions experience greater losses than the lateral fundamental mode in the central region of the waveguide region.

The above-described possibilities for the local variation of the losses by means of the trenches introduced into the waveguide region, in particular the number, the form and the depth of the trenches, can also be combined with one another. By way of example, both the number and the depth of the trenches can decrease from the edge regions of the waveguide region toward a central region of the waveguide region. Alternatively, by way of example, the sidewall steepness and the depth of the trenches can increase from a central region of the waveguide region toward the edge regions. It is thus possible to set the damping of the laser modes in a targeted manner across the width of the waveguide region, and in this way to increase the losses of the higher laser modes in such a way that the edge emitting semiconducting laser commences oscillation only in the lateral fundamental mode.

BRIEF DESCRIPTION OF THE DRAWINGS

The invention is explained in greater detail below on the basis of exemplary embodiments in connection with FIGS. 1 to 5.

Identical or identically acting constituent parts are provided with the same reference symbols in the figures. The constituent parts illustrated and also the size relationships of the constituent parts among one another should not be regarded as true to scale.

The following list of reference symbols may be used in conjunction with the drawings:
1 Semiconductor body
2 Waveguide region
3a Lower cladding layer
3b Upper cladding layer
4a Lower waveguide layer
4b Upper waveguide layer
5 Active layer
6 Structured region
7 Trench
8 Waveguide core
9 Side facet
10 Substrate
11 Contact layer
12 Contact layer
13 Intermediate layer
14 Coating
15 Coating
16 Sidewalls

DETAILED DESCRIPTION OF ILLUSTRATIVE EMBODIMENTS

Figure 1A:
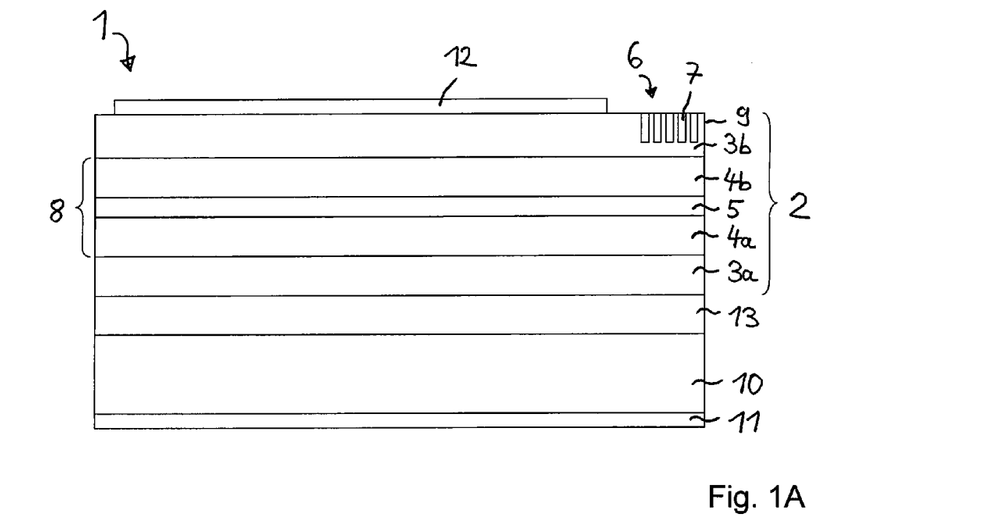
FIGS. 1A and 1B show an edge emitting semiconductor laser in accordance with a first exemplary embodiment in a cross section and in a plan view.
Figure 1B:
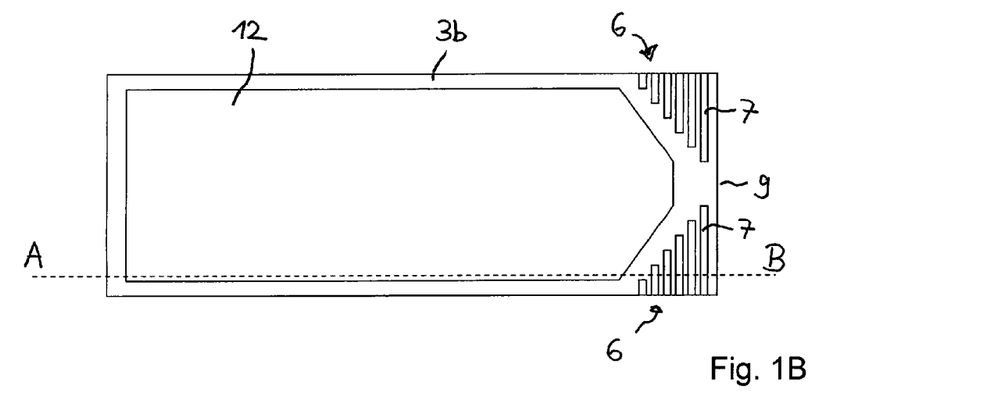

FIGS. 1A and 1B illustrate a first exemplary embodiment of an edge emitting semiconductor laser. FIG. 1A shows a cross section along the line A-B of the plan view illustrated in FIG. 1B.

The edge emitting semiconductor laser has a semiconductor body 1 containing a waveguide region 2. The waveguide region 2 comprises a lower waveguide layer 4a and an upper waveguide layer 4b, between which is arranged an active layer 5 provided for generating laser radiation.

The active layer 5 of the edge emitting semiconductor laser can be, in particular, a single or multiple quantum well structure.

The waveguide layers 4a, 4b with the active layer 5 embedded therebetween form a waveguide core 8. The waveguide core 8 is arranged between a lower cladding layer 3a and an upper cladding layer 3b succeeding the waveguide core 8 in the growth direction of the semiconductor body 1. The lower cladding layer 3b is arranged on a side facing a substrate 10 of the semiconductor body 1, and the upper cladding layer 3b is arranged on a side of the semiconductor body 1 which faces away from the active layer 5 as seen from the substrate 10.

One or a plurality of intermediate layers 13 can be arranged between the substrate 10 of the semiconductor body 1 and the lower cladding layer 3a. Electrical contact is made with the edge emitting semiconductor laser, for example, by means of a first electrical contact layer 11 at the rear side of the substrate 10 facing away from the active layer 5, and a second electrical contact layer 12 at a top side of the semiconductor body 1 facing away from the substrate 10. One or a plurality of further intermediate layers (not illustrated) can be arranged between the upper cladding layer 3b and the electrical contact layer 12.

The cladding layers 3a, 3b advantageously have a lower refractive index than the waveguide layers 4a, 4b, as a result of which the laser radiation propagating in a lateral direction is guided substantially in the waveguide core 8. Owing to the finite difference in refraction between the waveguide layers 4a, 4b and the cladding layers 3a, 3b, however, the laser modes also propagate at least partly into the cladding layers 3a, 3b. Therefore, it is possible for the laser modes which propagate in the waveguide region 2 to be influenced by a change in the properties of the cladding layers 3a, 3b.

In the exemplary embodiment illustrated, the waveguide region 2 has structured regions 6 arranged in the vicinity of a side facet 9 of the semiconductor body 1. The structured regions 6 are each formed exclusively in the upper cladding layer 3b.

The structured regions 6 in each case comprise a plurality of trenches 7 extending from the top side of the semiconductor body 1 into the upper cladding layer 3b. The trenches 7 are situated in a region of the upper cladding layer 3b from which the second contact layer 12 is omitted. Alternatively, however, it would also be possible to arrange one or a plurality of trenches below the second contact layer 12.

The trenches preferably have a depth of between 500 nm and 1500 nm inclusive. The trenches 7 preferably extend into the upper cladding layer 3b with a depth such that no more than 300 nm of the upper cladding layer remain below the deepest location of the trenches. By way of example, given an upper cladding layer having a thickness of 1000 nm, the trenches should have a depth of at least 700 nm.

The width of the trenches is preferably between 1 µm and 4 µm inclusive, for example, 2 µm.

The trenches 7 run parallel to the layer plane of the upper cladding layer 3b and preferably parallel to the side facet 9 of the semiconductor body 1. In particular, the trenches 7 run parallel to one another and perpendicular to the longitudinal sides of the semiconductor chip 1. The trenches 7 can be arranged periodically, in particular, that is to say that they have identical distances from one another.

The trenches run from an edge region of the upper cladding layer 3b, in particular, from the longitudinal sides of the semiconductor chip 1, in the direction of the center of the upper cladding layer 3b. In this case, the trenches 7 extend into the upper cladding layer 3b to different extents.

As can be discerned in the plan view in FIG. 1B, the trenches 7 can extend into the center of the upper cladding layer 3b, for example, all the further, the smaller their distance from the side facet 9 of the semiconductor body 1. In this case, the lateral extent of the trenches 7 can vary in a stepwise manner, for example. The two structured regions 6 with the trenches 7 are preferably arranged symmetrically on both sides of the semiconductor body 1. In this case, the center of the waveguide region 2 is free of trenches 7.

What is achieved by the arrangement of the trenches 7 is that the lateral fundamental mode, upon propagating in the waveguide region 2, experiences lower losses than higher laser modes. This is based on the fact that the laser radiation propagating at least partly in the cladding layer 3b has to penetrate through a larger number of trenches 7 in the edge regions than in the center of the waveguide region 2, and, consequently, higher laser modes experience comparatively high losses. At the sidewalls of the trenches 7, scattering losses occur as in the case of the butt coupling of different layer waveguides. In this case, part of the energy of the electric field crosses over from the waveguide region into non-waveguide regions.

By contrast, the influence of the trenches 7 on the lateral fundamental mode having an intensity maximum in the center of the waveguide region 2 is only low.

The losses experienced by a circulating laser mode upon traversing the structured regions 6 can be influenced, in particular, by the spatial arrangement and the number of the trenches 7. Furthermore, in particular, the depth and the form of the sidewalls of the trenches 7 also influence the energy loss of the laser mode upon traversing the trenches. The energy loss upon traversing the trenches is substantially brought about by way of scattering of the laser radiation. Preferably, the trenches 7 are not filled with a material that is absorbent with respect to the laser radiation; in particular, the trenches 7 can be free of solid material and contain air, for example. Although the modes propagating in the waveguide can also be influenced by absorbent structures, structures having only insignificant absorption have the advantage that only a small heat input into the semiconductor body 1 takes place.

The trenches 7 can be produced in the semiconductor body 1 by means of an etching method, in particular. In this case, known methods of photolithography can be used for targeted structuring.

FIGS. 2A to 2D illustrate a method for producing an exemplary embodiment of an edge emitting semiconductor laser on the basis of schematically illustrated intermediate steps.

Figure 2A:
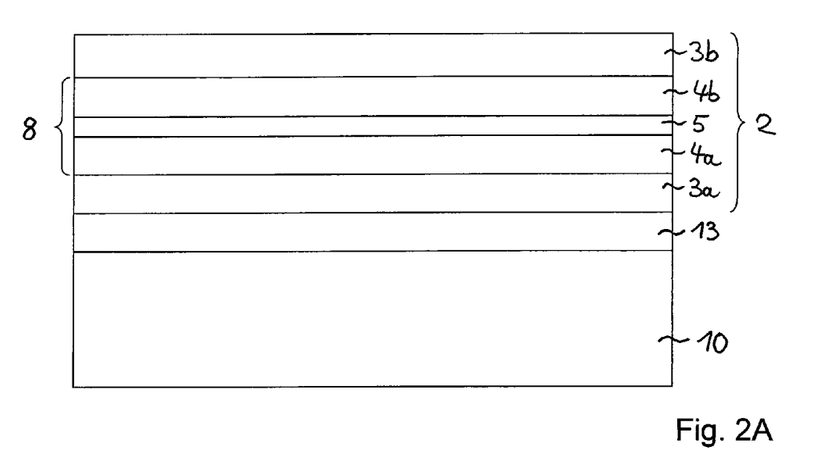
FIGS. 2A to 2D show an exemplary embodiment of a method for producing an edge emitting semiconductor laser on the basis of schematically illustrated intermediate steps.

As illustrated in FIG. 2A, firstly the semiconductor layer sequence of the edge emitting semiconductor laser is grown onto a substrate 10. The semiconductor layers are preferably grown epitaxially, for example, by means of MOVPE. One or a plurality of intermediate layers 13, for example, buffer layers, a lower cladding layer 3a, a lower waveguide layer 4a, an active layer 5, an upper waveguide layer 4b and the upper cladding layer 3b are deposited successively onto the substrate 10. The active layer 5 enclosed between the waveguide layers 4a, 4b and the cladding layers 3a, 3b form the waveguide region 2.

The semiconductor layer sequence of the edge emitting semiconductor laser can be based on a III-V compound semiconductor material, in particular. Depending on the wavelength of the edge emitting semiconductor laser, arsenide, phosphide or nitride compound semiconductor materials, for example, can be used. By way of example, the semiconductor layer sequence can contain $In_xAl_yGa_{1-x-y}As$, $In_xAl_yGa_{1-x-y}P$ or $In_xAl_yGa_{1-x-y}N$, in each case where $0 \leq x \leq 1$, $0 \leq y \leq 1$ and $x+y \leq 1$. In this case, the III-V compound semiconductor material need not necessarily have a mathematically exact composition according to one of the above formulae. Rather, it can comprise one or a plurality of dopants and also additional constituents which substantially do not change the physical properties of the material. For the sake of simplicity, however, the above formulae only include the essential constituents of the crystal lattice, even if these can be replaced in part by small amounts of further substances.

In this case, the material selection is effected on the basis of the desired emission wavelength of the semiconductor laser. The substrate 10 is selected on the basis of the semiconductor layer sequence, which is preferably to be grown epitaxially, and can be, in particular, a GaAs, GaN or silicon substrate.

The active layer 5 can be composed of a plurality of individual layers, in particular, a single or multiple quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

Figure 2B:
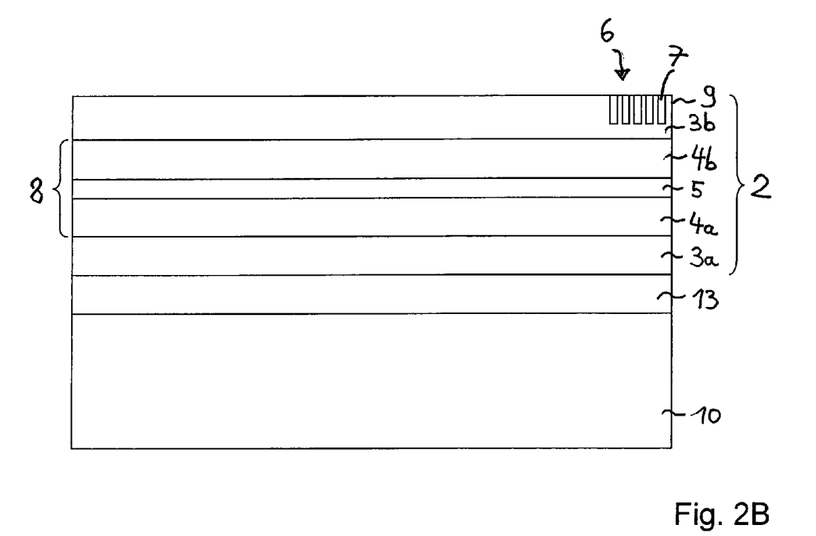

In the intermediate step illustrated in FIG. 2B, a structured region 6 has been produced in the waveguide region 2 by trenches 7 having been etched into the upper cladding layer 3b. The trenches 7 can be formed, for example, as in the case of the exemplary embodiment illustrated in FIGS. 1A and 1B and can extend, in particular, in the layer plane of the upper cladding layer 3b parallel to the sidewall 9 of the semiconductor chip 1.

Figure 2C:
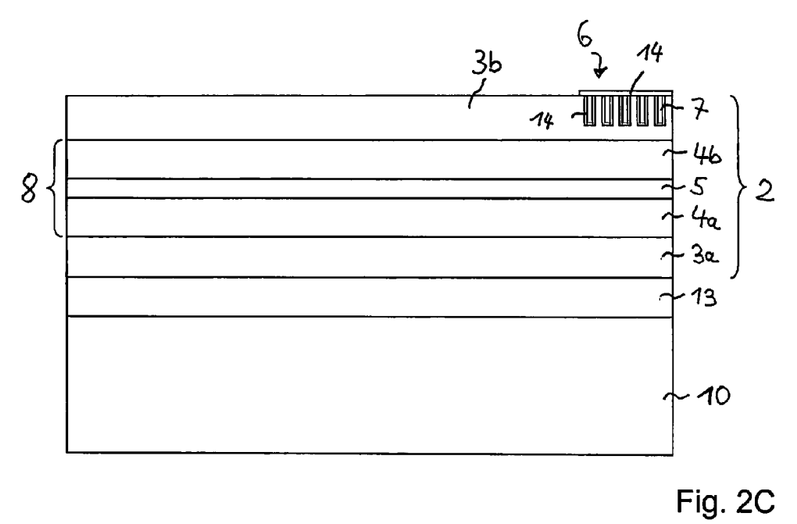

The structured region 6, for example a region pervaded by trenches 7, can be provided with a coating 14 in a further method step, as is illustrated in FIG. 2C. In particular, a passivation layer 14 can be applied to the structure produced in the waveguide region 2. The passivation layer 14 can be, for example, a silicon nitride layer. The coating 14 applied to the structured region 6 can at least partly fill the trenches 7, as illustrated in FIG. 2C, such that, for example, the bottom and the sidewalls of the trenches 7 are covered by the passivation layer 14.

Figure 2D:
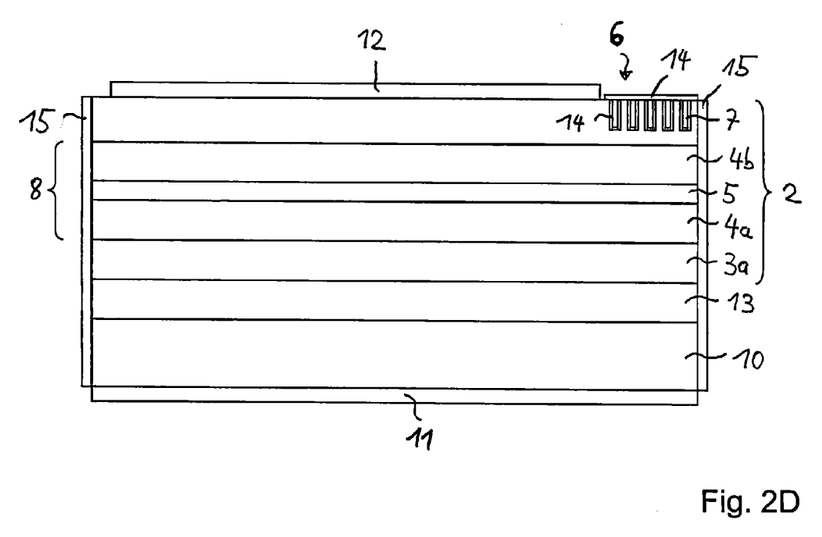

In the method step illustrated in FIG. 2D, contact metallizations 11, 12 have been applied to the rear side of the substrate 10 facing away from the semiconductor layers, and to the surface of the semiconductor body 1 lying opposite the substrate 10. The contact metallizations 11, 12 are formed from a metal or a metal alloy, for example. The contact metallizations need not necessarily be individual layers, rather they can also be composed of a plurality of partial layers, for example a titanium-platinum-gold layer sequence.

Furthermore, in the method step illustrated in FIG. 2D, a coating 15 has been applied to the side facets 9 of the semiconductor body 1. The coating 15 can be, in particular, a reflection-increasing coating, for example a dielectric mirror. The dielectric minor can for example contain a multiplicity of alternating dielectric layers and increases the reflection at the side facets of the semiconductor body for the formation of a laser resonator.

Figure 3A:
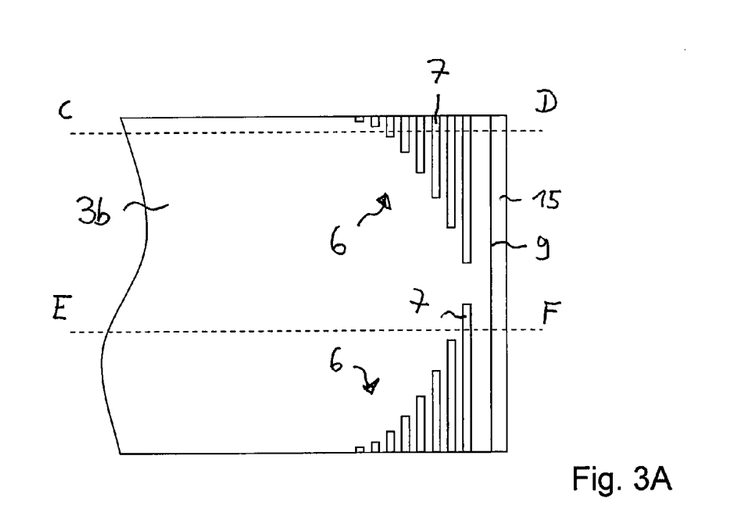
FIG. 3A to 3C show the structured region in a further exemplary embodiment of the edge emitting semiconductor laser in a plan view and in sectional illustrations.
Figure 3B:
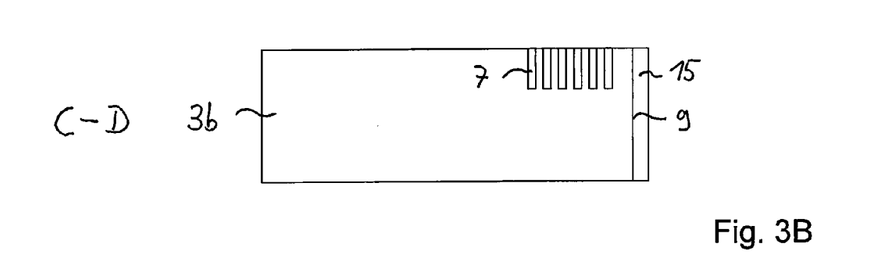
Figure 3C:
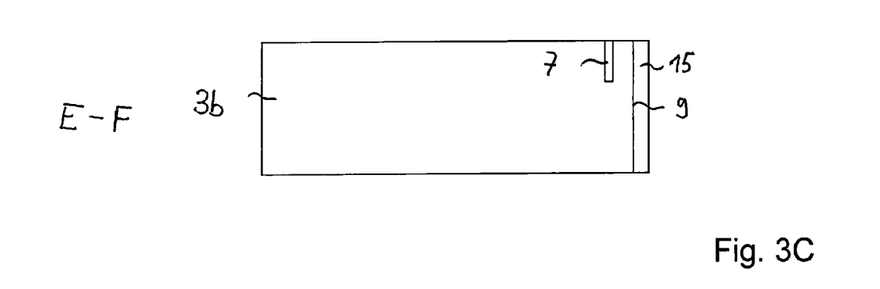

A further exemplary embodiment of the structured region 6 in the upper cladding layer 3b is illustrated in FIG. 3A in a plan view, in FIG. 3B in a sectional illustration along the line C-D from FIG. 3A, and in FIG. 3C in a sectional illustration along the line E-F from FIG. 3A.

As in the case of the exemplary embodiment illustrated in FIG. 1, the trenches 7 run parallel to a side facet 9 of the semiconductor laser, the side facet 9 being provided with a reflection-increasing coating 15. The trenches 7 extend from edge regions of the upper cladding layer 3b into the center of the upper cladding layer 3b. In the two opposite edge regions of the upper cladding layer 3b, in each case eight trenches 7, for example, are arranged symmetrically with respect to a longitudinal axis of the semiconductor body, the trenches extending from the edge of the semiconductor body into the center of the semiconductor body to different extents. In this case, the lateral extent of the trenches 7 in the direction parallel to the side facet 9 of the semiconductor laser increases with decreasing distance toward the side facet 9.

FIG. 3B shows a section through the upper cladding layer along the line C-D in the outer region of the semiconductor body. The sectional illustration shows only the upper cladding layer 3b without the underlying semiconductor layers. The sectional view illustrates the fact that the laser radiation has to pass a plurality of trenches 7 upon propagating in the emission direction in the outer region of the upper cladding layer.

The section along the line E-F, as illustrated in FIG. 3C, illustrates the fact that the laser radiation only has to pass one trench 7, by contrast, upon propagating in the inner region of the upper cladding layer 3b. As can be discerned in the plan view in FIG. 3A, the center of the upper cladding layer 3b is even free of trenches 7. By virtue of the fact that the number of trenches 7 which the laser radiation has to pass upon propagating in the upper cladding layer 3b increases from the edge region toward the center of the waveguide region, higher laser modes, upon propagating in the emission direction, experience higher losses than the lateral fundamental mode of the laser radiation. The number, the lateral extent and the depth of the trenches 7 can be optimized, for example, by simulation calculations in such a way that a desired mode profile of the laser radiation is obtained.

FIGS. 4A to 4D show a further exemplary embodiment of the structured region 6 in the upper cladding layer 3b. In contrast to the exemplary embodiments illustrated previously, in this exemplary embodiment only a single trench 7 is produced in the upper cladding layer 3b. The trench 7 runs parallel to the side facet 9 of the semiconductor body in the upper cladding layer 3b. In order to obtain a local variation of the losses of the laser modes in the direction perpendicular to the emission direction, the depth of the trench 7 varies in the longitudinal direction of the trench, that is to say in the direction parallel to the side facet of the semiconductor laser 9.

Figure 4A:
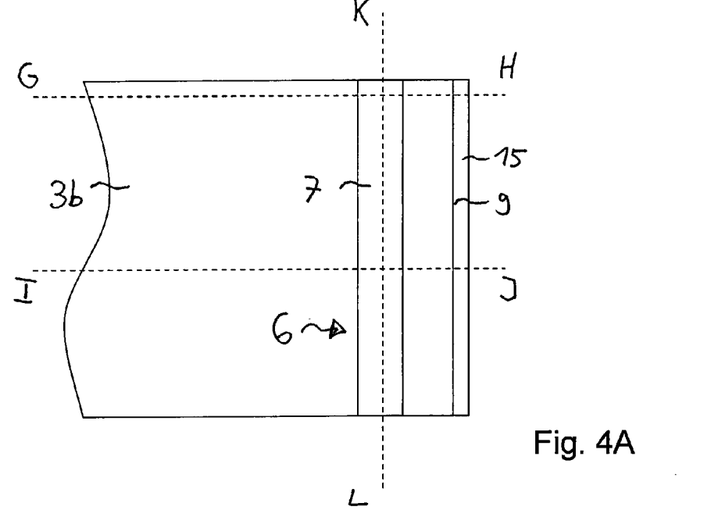
FIGS. 4A to 4D show the structured region in a further exemplary embodiment of the edge emitting semiconductor laser in a plan view and in sectional illustrations.
Figures 4B, 4C, 4D:
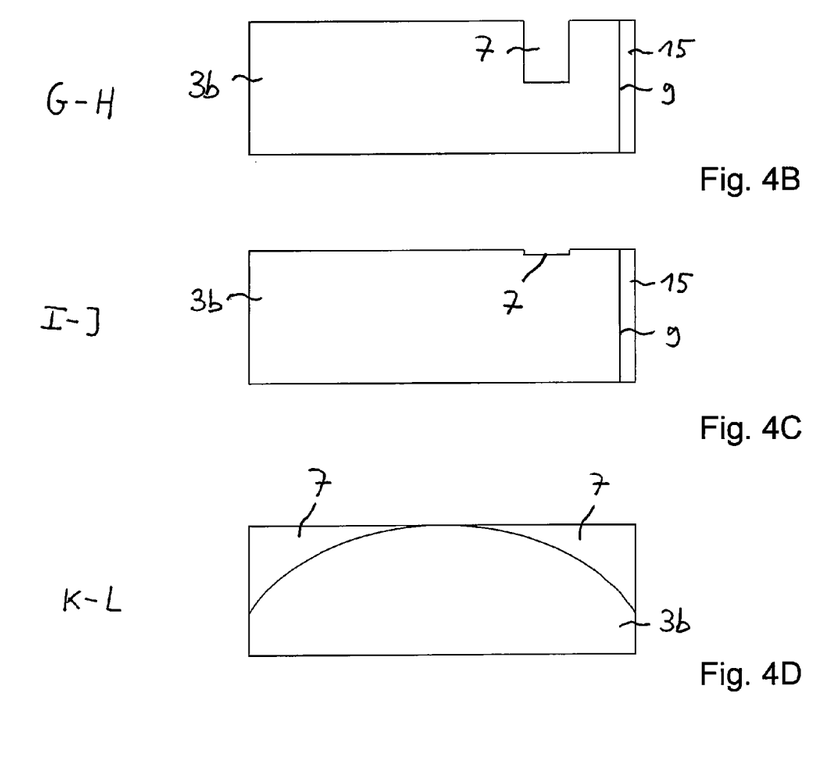

The section along the line G-H, as illustrated in FIG. 4B, shows that the trench 7 has a comparatively large depth in the edge region of the upper cladding layer.

By contrast, the trench 7, as illustrated by the section along the line I-J in FIG. 4C, has only a comparatively small depth in the inner region of the upper cladding layer 3b.

The depth profile of the trench 7 along its longitudinal direction along the line K-L is illustrated in FIG. 4D. By virtue of the fact that the depth of the trench increases from the center of the upper cladding layer 3b toward the edge regions, the laser modes upon propagating in the emission direction experience greater losses in the edge regions than in the center of the upper cladding layer 3b. As in the previous exemplary embodiments, the propagation of the lateral fundamental mode having an intensity maximum in the central region of the waveguide region is fostered in this way. In particular, single-mode operation of the semiconductor laser can be achieved in this way.

The local variation of the etching depth during the production of the trench 7 can be effected, for example, by proportional transfer of a photoresist layer in a sputtering or etching step with suitable selectivity.

Figure 5A:
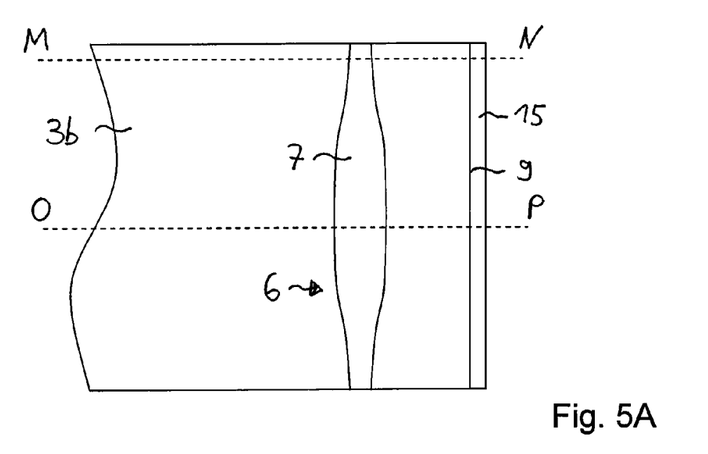
FIGS. 5A to 5C show the structured region in a further exemplary embodiment of the edge emitting semiconductor laser in a plan view and in sectional illustrations.
Figure 5B:
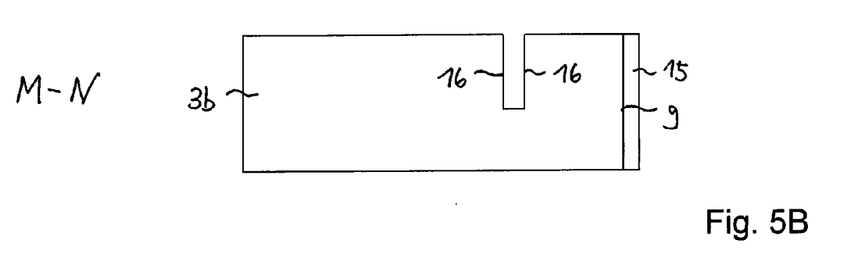
Figure 5C:
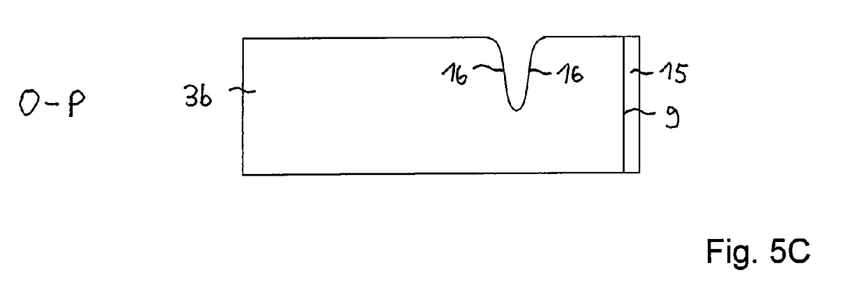

A further exemplary embodiment of the structured region 6 in the upper cladding layer 3b is illustrated in FIGS. 5A to 5C. As can be discerned in the plan view in FIG. 5A, as in the previous exemplary embodiment, a single trench 7 extends in a direction parallel to the side facet 9 of the semiconductor laser in the upper cladding layer 3b. In order to obtain a local variation of the losses experienced by a laser mode upon propagating in the emission direction, in this exemplary embodiment it is not the depth of the trench that varies, but rather the form of sidewalls 16 along the longitudinal direction of the trench 7. A local variation of the form of the sidewalls 16 of the trench 7 can be carried out by structuring a photoresist with a variable dose by multistage exposure by means of electron beam or laser lithography or with greyscale masks.

The section along the line M-N as illustrated in FIG. 5B illustrates the fact that the trench 7 has a rectangular cross-sectional profile in the outer region of the upper cladding layer 3b.

In the inner region of the upper cladding layer, by contrast, the trench 7 has a rounded cross-sectional profile, as shown by the cross section along the line O-P as illustrated in FIG. 5C. The laser modes experience lower losses upon traversing the rounded cross-sectional profile in the inner region of the trench 7 than upon traversing the rectangular cross-sectional profile of the trench 7 in the outer region of the upper cladding layer 3b. As in the previous exemplary embodiments, what is achieved in this way is that the higher laser modes upon propagating in the emission direction experience higher losses than the lateral fundamental mode having an intensity maximum in the inner region of the upper cladding layer 3b.

The above-described possibilities for the local variation of the losses of the laser modes by local variation of the number of trenches, the depth of the trenches or the form of the sidewall of the trenches can, of course, be combined with one another.

As an alternative to the formation of trenches, a local variation of the losses can also be effected by selectively introducing dopants into the upper cladding layer. In this case, by way of example, the concentration of the dopant introduced can increase from a central region of the upper cladding layer toward the edge regions. The laser modes are therefore damped to a greater extent in the edge regions, as a result of absorption and/or scattering at the additionally introduced dopant, than in a central region of the waveguide region.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An edge emitting semiconductor laser comprising a semiconductor body having a waveguide region, wherein,
    the waveguide region has a lower cladding layer, a lower waveguide layer, an active layer for generating laser radiation, an upper waveguide layer and an upper cladding layer,
    the waveguide region has at least one structured region for mode selection in which a lateral fundamental mode of the laser radiation experiences lower losses than the laser radiation of higher laser modes,
    the at least one structured region comprises at least one trench which extends from a top side of the semiconductor body into the upper cladding layer,
    the at least one trench has a depth such that no more than 300 nm of the upper cladding layer remain below a deepest location of the at least one trench, and
    wherein the at least one trench has a variable depth that decreases from an edge region toward a central region of the waveguide region.

2. The edge emitting semiconductor laser according to claim 1, wherein the depth of the at least one trench is not greater than a thickness of the upper cladding layer.

3. The edge emitting semiconductor laser according to claim 1, wherein the at least one structured region is formed exclusively in the upper cladding layer.

4. The edge emitting semiconductor laser according to claim 1, wherein the at least one trench has a depth of between 500 nm and 1500 nm.

5. The edge emitting semiconductor laser according to claim 1, wherein the at least one trench has a width of between 1 μm and 4 μm.

6. The edge emitting semiconductor laser according to claim 1, wherein the at least one trench runs parallel to a side facet of the semiconductor laser.

7. The edge emitting semiconductor laser according to claim 1, wherein the at least one trench extends from an edge region of the waveguide region in a direction of a center of the waveguide region.

8. The edge emitting semiconductor laser according to claim 7, wherein the at least one trench comprises a plurality of trenches that extend from an edge region of the waveguide region into the center of the waveguide region to different extents.

9. The edge emitting semiconductor laser according to claim 8, wherein a number of trenches which are passed by the laser radiation propagating in the waveguide region decreases from the edge region toward a central region of the waveguide region.

10. The edge emitting semiconductor laser according to claim 1, wherein a central region of the waveguide region is free of trenches.

11. The edge emitting semiconductor laser according to claim 1, wherein the at least one trench has sidewalls having a variable form.

12. The edge emitting semiconductor laser according to claim 11, wherein the sidewalls have a variable sidewall steepness.

13. The edge emitting semiconductor laser according to claim 12, wherein the sidewall steepness decreases from an edge region toward a central region of the waveguide region.

* * * * *